United States Patent [19]

Nakao et al.

[11] Patent Number: 5,434,031
[45] Date of Patent: Jul. 18, 1995

[54] POSITIVE-WORKING NAPHTHOQUINONE DIAZIDE PHOTORESIST COMPOSITION CONTAINING SPECIFIC HYDROXY COMPOUND ADDITIVE

[75] Inventors: Taku Nakao; Remi Numata; Kousuke Doi; Nobuo Tokutake; Hidekatsu Kohara; Toshimasa Nakayama, all of Kanagawa, Japan

[73] Assignee: Tokyo Ohka Kogyo Co., Ltd., Japan

[21] Appl. No.: 153,100

[22] Filed: Nov. 17, 1993

[30] Foreign Application Priority Data

Nov. 18, 1992 [JP] Japan .................................. 4-331180

[51] Int. Cl.$^6$ ............................ G03F 7/023; G03C 1/61
[52] U.S. Cl. ........................................ 430/191; 430/192; 430/193
[58] Field of Search ........................... 430/191, 192, 193

[56] References Cited

U.S. PATENT DOCUMENTS 4,594,306 6/1986 Stahlhofen et al. .................. 430/191
5,302,489 4/1994 Sha ........................................ 430/191

FOREIGN PATENT DOCUMENTS 58-80636 5/1983 Japan .
2-971 1/1990 Japan .

Primary Examiner—Charles L. Bowers, Jr.
Assistant Examiner—Christopher G. Young
Attorney, Agent, or Firm—Wenderoth, Lind & Ponack

[57] ABSTRACT

Disclosed is a positive-working photoresist composition suitable for use in the photolithographic fine patterning work in the manufacture of electronic devices such as VLSIs. The composition comprises, in addition to an alkali-soluble novolac resin as a film-forming ingredient and an esterification product of naphthoquinone-1,2-diazide sulfonic acid as a photosensitive ingredient, a unique additive compound which is an alkyl or aralkyl ester of 2-hydroxy benzoic acid, such as benzyl salicylate, or a phenol compound substituted at least one alkyl group such as 2-tert-butyl-4-methyl phenol. By virtue of the addition of this unique additive, the inventive photoresist composition exhibits an excellent performance of suppressing the standing wave effect in addition to the excellent photosensitivity, resolving power and depth of focusing in the patterning exposure to light as well as good heat resistance of the patterned resist layer.

9 Claims, No Drawings

POSITIVE-WORKING NAPHTHOQUINONE DIAZIDE PHOTORESIST COMPOSITION CONTAINING SPECIFIC HYDROXY COMPOUND ADDITIVE

BACKGROUND OF THE INVENTION

The present invention relates to a novel positive-working photoresist composition or, more particularly, to a positive-working photoresist composition having excellent photosensitivity, resolving power and depth of focusing and capable of giving a patterned resist layer having excellent heat resistance and satisfactorily orthogonal cross sectional profile of the patterned resist layer with a remarkably suppressed standing wave effect or, namely, an adverse effect caused by the interference of the incident light to the resist layer and the reflecting light from the substrate surface.

As is well known, it is a remarkable trend in recent years in the manufacture of electronic devices such as ICs, LSIs, VLSIs and the like that the degree of integration is rapidly increasing year by year and the patterning works on the substrate such as semiconductor silicon wafers and the like are required to have extremely high fineness of submicron order, for example, in the manufacture of VLSIs. In order to comply with such a requirement, the photoresist composition or, in particular, the positive-working photoresist composition used for the photolithographic patterning work is also required to exhibit high performance relative to the photosensitivity, resolving power and depth of focusing as well as heat resistance of the patterned photoresist layer. In the modern photolithographic patterning process for the manufacture of VLSIs, furthermore, it is eagerly desired to develop a positive-working photoresist composition in which the adverse influence by the so-called standing wave effect is suppressed as completely as possible in addition to the above mentioned requirements. Nevertheless, it is the present status in the technology of photoresist compositions that a positive-working photoresist composition satisfying all of the above mentioned requirements is not available.

For example, Japanese Patent Kokai 2-971 proposes a method for the formation of a patterned resist layer by using a positive-working photoresist composition formulated with a hydroxybenzophenone of an increased degree of esterification as the photosensitive ingredient with an object to suppress the effects of intramembrane multipath reflection, the bulk effect and the standing wave effect. Although these undesirable phenomena can be suppressed to some extent in this positive-working photoresist composition, the improvement achieved in this composition is not quite satisfactory and, in addition, the performance thereof is not so high relative to the photosensitivity and the resolving power as to comply with the requirements in the manufacture of modern electronic devices such as VLSIs.

SUMMARY OF THE INVENTION

The present invention accordingly has an object to provide a novel positive-working photoresist composition having excellent photosensitivity, resolving power and depth of focusing and capable of giving a patterned resist layer which is excellent in the heat resistance and orthogonality of the cross sectional profile of the line pattern by suppressing the standing wave effect or, namely, the adverse influences due to the interference of the incident light for exposure and the reflecting light from the substrate surface.

Thus, the present invention provides, as a first embodiment, a positive-working photoresist composition which comprises, as a uniform mixture:

(a) an alkali-soluble novolac resin;

(b1) a photosensitive ingredient which is i) an esterification product of the compound selected from the group consisting of 1-[1-(4-hydroxyphenyl)isopropyl]-4-[1,1-bis(4-hydroxyphenyl)ethyl] benzene, tris(hydroxyphenyl)methanes, tris(cyclohexylhydroxyphenyl)methanes and [(poly)hydroxyphenyl] alkanes with naphthoquinone-1,2-diazide sulfonic acid, or ii) a combination of at least two compounds selected from the group consisting of the naphthoquinone-1,2-diazide sulfonic acid eaters of polyhydroxybenzophenones, 1-[1-(4-hydroxyphenyl) isopropyl]-4-[1,1-bis(4-hydroxyphenyl)ethyl] benzene, tris(hydroxyphenyl)methanes, tris(cyclohexylhydroxyphenyl) methanes and [(poly)hydroxyphenyl] alkanes; and (c) a hydroxy-substituted benzoic acid ester represented by the above given general formula

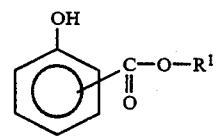

in which $R^1$ is an alkyl group having 1 to 12 carbon atoms or an aralkyl group having 7 to 10 carbon atoms.

Further, the present invention provides, as a second embodiment, a positive-working photoresist composition which comprises, as a uniform mixture:

(a) an alkali-soluble novolac resin;

(b) an esterification product of an aromatic polyhydroxy compound with naphthoquinone-1,2-diazide sulfonic acid; and (d) an aromatic hydroxy compound represented by the general formula

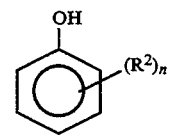

in which $R^2$ is an alkyl group having 1 to 5 carbon atoms and n is a positive integer not exceeding 5.

DETAILED DESCRIPTION OF THE PREFERRED EMBODIMENTS

As is described above, the positive-working photoresist composition of the invention comprises, as the essential ingredients on one hand, the components (a), (b1) and (c) and, on the other hand, the components (a), (b) and (d) in combination. The component (a) is an alkali-soluble novolac resin which serves as a film-forming agent. The type of the novolac resin is not particularly limitative and can be selected from those conventionally used as the film-forming agent in various positive working photoresist compositions in the prior art including the novolac resins obtained by the condensation reaction of an aromatic hydroxy compound such as phenol, cresols, xylenols and the like and an aldehyde such as formaldehyde and the like in the presence of an acidic catalyst such as oxalic acid without particular limitations.

The alkali-soluble novolac resin as the component (a) in the inventive composition should have a weight-average molecular weight in the range from 2000 to 20000 or, preferably, from 5000 to 15000 after removal of low molecular weight fractions in order for the patterned resist layer to exhibit excellent heat resistance.

The photosensitive ingredient in the inventive photoresist composition, on one hand, is the component (b) which is a quinone diazide group-containing compound including partial or full esterification products or amidated products of an aromatic polyhydroxy or polyamino compound and a quinone diazide group-containing sulfonic acid such as naphthoquinone -1,2-diazide-5-sulfonic acid, naphthoquinone-1,2-diazide -4-sulfonic acid, o-benzoquinone diazide sulfonic acid, o-naphthoquinone diazide sulfonic acid, o-anthraquinone diazide sulfonic acid and the like. Examples of the aromatic polyhydroxy or polyamino compound include: i) polyhydroxybenzophenone compounds such as 2,3,4-trihydroxybenzophenone, 2,3,4,4'-tetrahydroxybenzophenone and the like; ii) 1-[1-(4-hydroxyphenyl) isopropyl]-4-[1,1-bis(4-hydroxyphenyl)ethyl] benzene; iii) tris(hydroxyphenyl) methane compounds such as tris(4-hydroxyphenyl) methane, bis(4-hydroxy-3,5-dimethylphenyl) -4-hydroxyphenyl methane, bis(4-hydroxy-3,5-dimethylphenyl) -3-hydroxyphenyl methane, bis(4-hydroxy-3,5-dimethylphenyl) -2-hydroxyphenyl methane, bis(4-hydroxy-2,5-dimethylphenyl) -4-hydroxyphenyl methane, bis(4-hydroxy-2,5-dimethylphenyl) -3-hydroxyphenyl methane, bis(4-hydroxy-2,5-dimethylphenyl) -2-hydroxyphenyl methane, bis(4-hydroxy-3,5-dimethylphenyl) -3,4-dihydroxyphenyl methane, bis(4-hydroxy-2,5-dimethylphenyl)-3,4-dihydroxyphenyl methane and the like; iv) tris(cyclohexylhydroxyphenyl) methane compounds such as bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(5-cyclohexyl-4-hydroxy-2-methylphenyl)-2-hydroxyphenyl methane, bis(5-cyclohexyl-4-hydroxy-2-methylphenyl)-3-hydroxyphenyl methane, bis(5-cyclohexyl-4-hydroxy-2-methylphenyl) -4-hydroxyphenyl methane, bis(5-cyclohexyl-4-hydroxy-2-methylphenyl) 3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(5-cyclohexyl-2-hydroxy-4-methylphenyl)-2-hydroxyphenyl methane, bis(5cyclohexyl-2-hydroxy-4-methylphenyl)-4-hydroxyphenyl methane, bis(5-cyclohexyl-2-hydroxy-4-methylphenyl)-3,4-dihydroxyphenyl methane and the like; and v) [(poly) hydroxyphenyl] alkanes such as 2-(2,3,4-trihydroxyphenyl)-2-(2', 3', 4'-trihydroxyphenyl) propane, 2-(2,4-dihydroxyphenyl)-2-(2', 4'-dihydroxyphenyl) propane, 2-(4-hydroxyphenyl)-2-(4'-hydroxyphenyl) propane, bis(2,3,4-trihydroxyphenyl) methane, (2,4-dihydroxyphenyl) methane and the like; and vi) phenol, p-methoxyphenol, dimethyl phenol, hydroquinone, bisphenol A, naphthol, pyrocatechol, pyrogallol monomethyl ether, pyrogallol-1,3-dimethyl ether, gallic acid, partially or fully esterified or etherified gallic acid, aniline, p-amino diphenyl amine and the like. These compounds as the component (b) in the inventive composition can be used either singly or as a combination of two kinds or more with an object to improve the photosensitivity, resolving power, heat resistance and depth of focusing. It is preferable, in particular, to use an esterification product of the compound belonging to the groups ii), iii), iv) or v) with naphthoquinone-1,2-diazide sulfonic acid or a combination of at least two compounds selected from the esterification propducts of the compounds belonging to the groups i), ii), iii), iv) or v) with naphthoquinone -1,2-diazide sulfonic acid in respect of the well-balanced improvement in the performance of the photoresist composition.

Particularly preferable compounds to be esterified include: 2,3,4-trihydroxy benzophenone and 2,3,4,4'-tetrahydroxy benzophenone among the compounds of the group i); bis(4-hydroxy-3,5-dimethylphenyl)-2-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane and bis(4-hydroxy-2,5-dimethylphenyl)-3,4-dihydroxyphenyl methane among the compounds of the group iii); bis(5-cyclohexyl -4-hydroxy-2-methylphenyl)-2-hydroxyphenyl methane, bis(5-cyclohexyl-4-hydroxy-2-methylphenyl)-3-hydroxyphenyl methane, bis(5-cyclohexyl-4-hydroxy-2-methylphenyl)-4-hydroxyphenyl methane and bis(5-cyclohexyl-4-hydroxy-2-methylphenyl) -3,4-dihydroxyphenyl methane among the compounds of the group iv); and 2-(2,3,4-trihydroxyphenyl)-2-(2', 3', 4'-trihydroxyphenyl) propane, 2-(2,4-dihydroxyphenyl)-2-(2', 4'-dihydroxyphenyl) propane, 2-(4-hydroxyphenyl)-2-(4'-hydroxyphenyl) propane, bis(2,3,4-trihydroxyphenyl) methane and (2,4-dihydroxyphenyl) methane among the compounds of the group v).

The quinone diazide group-containing compound described above can be prepared by the full or partial esterification reaction of the above mentioned aromatic polyhydroxy compound with a naphthoquinone-1,2-diazide-4-sulfonyl halide or naphthoquinone-1,2-diazide-5-sulfonyl halide as the esterification agent. This esterification reaction is performed usually in an inert solvent, such as dioxane and the like, in the presence of an acid acceptor such as triethanol amine, alkali carbonates, alkali hydrogen carbonates and the like by using an appropriate molar amount of the esterification agent per mole of the aromatic polyhydroxy compound to be esterified. It is preferable that naphthoquinone-1,2-diazide -(2)-5-sulfonyl chloride or naphthoquinone-1,2-diazide-(2)-4sulfonyl chloride is used in an amount sufficient to esterify at least 50% or, more preferably, at least 60% of the hydroxy groups or amino groups in the above named polyhydroxy or polyamino compounds of the groups i) to vi) or, namely, to give a esterified compound having a degree of esterification of at least 50% or, more preferably, at least 60% in respect of the improvement in the photosensitivity and resolving power.

The amount of the component (b) as the photosensitizing ingredient in the inventive composition is in the range of, usually, from 5 to 200 parts by weight or, preferably, from 16 to 100 parts by weight per 100 parts by weight of the alkali-soluble novolac resin as the component (a). When the amount thereof is too small, no full fidelity can be obtained in the patterned resist layer to the pattern on the photomask along with a decrease in the transferability of the pattern while, when the amount is too large, the patterned resist layer has decreased uniformity resulting in a decrease in the resolving power as a trend.

The component (c), which is the most characteristic ingredient in the inventive positive-working photoresist composition according to the first embodiment, is a hydroxy-substituted benzoic acid ester represented by the above given general formula (I) in which $R^1$ is an alkyl group having 1 to 12 carbon atoms such as methyl, ethyl, propyl, butyl, hexyl, octyl and lauryl groups or an aralkyl group having 7 to 10 carbon atoms such as benzyl, 2-phenylethyl and 3-phenylpropyl groups. Particular examples of the hydroxy-substituted benzoic acid ester include methyl 2-, 3- or 4-hydroxybenzoate, ethyl 2-, 3- or 4-hydroxybenzoate, butyl 2-, 3- or 4-hydroxybenzoate, amyl 2-, 3- or 4-hydroxybenzoate, hexyl 2-, 3- or 4-hydroxybenzoate, benzyl 2-, 3- or 4-hydroxybenzoate, octyl 2-, 3- or 4-hydroxybenzoate, dodecyl 2-, 3- or 4-hydroxybenzoate and the like. These benzoate compounds can be used either singly or in combination of 2 kinds or more according to need. When the alkyl group forming the ester compound has 3 or more carbon atoms, the alkyl group can be either linear or branched. Among the above named benzoate compounds, esters of 2-hydroxybenzoic acid or, namely, salicylic acid are preferred. Benzyl salicylate is particularly preferable.

The amount of the hydroxybenzoate compound as the component (c) in the inventive photoresist composition, which serves to increase the photosensitivity of the composition and suppress the standing wave effect in the photoresist layer, is in the range from 2 to 10 parts by weight or, preferably, from 2 to 5 parts by weight per 100 parts by weight of the alkali-soluble novolac resin as the component (a). When the amount thereof is too small, the desired suppressing effect on the standing wave effect would be insufficient while, when the amount thereof is too large, the depth of focusing is decreased in the photolithographic patterning and the heat resistance of the patterned resist layer would be decreased.

In place of or in combination with the above described hydroxybenzoate compound as the component (c), the inventive positive-working photoresist composition contains, as the component (d), an aromatic hydroxy compound or phenolic compound substituted by one or more alkyl groups $R^2$ as represented by the above given general formula (II) in which the subscript n is a positive integer not exceeding 5. When the subscript n is 2 or larger or, namely, the phenolic compound is substituted by two or more alkyl groups, the substituent alkyl groups can be the same as or different from the others.

Particular examples of the phenolic compound represented by the above given general formula (II) and suitable as the component (d) in the inventive composition include 2-methyl phenol, 3-methyl phenol, 4-methyl phenol, 2,3-dimethyl phenol, 2,4-dimethyl phenol, 2,5-dimethyl phenol, 2,6-dimethyl phenol, 3,4-dimethyl phenol, 3,5-dimethyl phenol, 2-ethyl phenol, 3-ethyl phenol, 4-ethyl phenol, 2,3,4-trimethyl phenol, 2,3,5-trimethyl phenol, 2,3,6-trimethyl phenol, 2,4,5-trimethyl phenol, 2,4,6-trimethyl phenol, 3,4,5-trimethyl phenol, 2-isopropyl-3-methyl phenol, 2-isopropyl-4-methyl phenol, 2-isopropyl-5-methyl phenol, 2-isopropyl-6-methyl phenol, 3-isopropyl-2-methyl phenol, 3-isopropyl-4-methyl phenol, 3-isopropyl-5-methyl phenol, 4-isopropyl-2-methyl phenol, 5-isopropyl-2-methyl phenol, 2-tert-butyl-4-methyl phenol, 2-tert-butyl-5-methyl phenol, 2-tert-butyl-6-methyl phenol, 3-tert-butyl-2-methyl phenol, 3-tert-butyl-5-methyl phenol, 4-tert-butyl-5-methyl phenol, 4-tert-butyl-2-methyl phenol, 4-tert-butyl-3-methyl phenol, 5-tert-butyl-2-methyl phenol, 2-sec-butylphenol, 3-sec-butyl phenol, 4-sec-butyl phenol, 2-n-butyl-4-methyl phenol, 2-n-butyl-5-methyl phenol, 2-n-butyl-6-methyl phenol, 4-n-butyl-2-methyl phenol, 4-n-butyl-3-methyl phenol and the like, of which particularly preferable are 2-tert-butyl-5-methyl phenol, 2-tert-butyl-4-methyl phenol, 2-tert-butyl-6-methyl phenol and 4-tert-butyl-5-methyl phenol. These phenolic compounds can be used either singly or as a combination of two kinds or more according to need. Further, these phenolic compounds can be used in combination with the hydroxybenzoate compounds as the component (c).

The amount of the phenolic compounds represented by the above given general formula (II), which serve to increase the photosensitivity and to suppress the standing wave effect of the resist composition, in the inventive photoresist composition is in the range from 2 to 10 parts by weight or, preferably, from 2 to 5 parts by weight per 100 parts by weight of the alkali-soluble novolac resin as the component (a). When the component (d) is used in combination with the component (c), the total amount of the components (c) and (d) should be in the range from 2 to 10 parts by weight or, preferably, from 2 to 5 parts by weight per 100 parts by weight of the alkali-soluble novolac resin as the component (a). When the amount thereof is too small, no sufficient suppression can be obtained against the standing wave effect while, when the amount is too large, certain adverse influences are caused in the depth of focusing and heat resistance of the patterned resist layer.

It is optional with an object to further enhance the photosensitivity of the inventive photoresist composition that, in addition to the above described component (b) as the photosensitive ingredient, the inventive composition is admixed with another known photosensitizing compound such as polyhydroxybenzophenones, e.g., 2,3,4-trihydroxybenzophenone and 2,3,4,4'-tetrahydroxybenzophenone, 1-[1-(4-hydroxyphenyl)isopropyl]-4-[1,1-bis(4-hydroxyphenyl)ethyl] benzene, tris(hydroxyphenyl) methanes, e.g., tris(4-hydroxyphenyl) methane, bis(4-hydroxy-3,5-dimethylphenyl)-2-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane and bis(4-hydroxy-2,5-dimethylphenyl)-3,4-dihydroxyphenyl methane, and [(poly) hydroxyphenyl] alkanes. e.g., 2-(2,3,4-trihydroxyphenyl)-2-(2', 3', 4'-trihydroxyphenyl) propane, 2-(2,4-dihydroxyphenyl)-2-(2', 4'-dihydroxyphenyl) propane, 2-(4-hydroxyphenyl)-2-(4'-hydroxyphenyl) propane, bis(2,3,4-trihydroxyphenyl) methane and (2,4-dihydroxyphenyl) methane. Addition of these auxiliary photosensitizing agent has an effect of, in addition to the enhancement of the photosensitivity of the composition, decreasing the dimensional changes in the patterned resist layer depending on the exposure dose to light.

It is further optional to admix the inventive photoresist composition with a photosensitivity promoter such as mercapto oxazole, mercapto benzoxazole, mercapto oxazoline, mercapto benzothiazole, benzoxazoline, benzothiazolone, mercapto benzimidazole, urazol, thiouracil, mercapto pyrimidine and imidazolone as well as various derivatives thereof. These photosensitivity promoters can be used either singly or as a combination of two kinds or more according to need.

These photosensitivity promoters, when used, are admixed with the inventive composition in an amount in the range from 0.1 to 30 parts by weight or, preferably, from 0.5 to 25 parts by weight per 100 parts by weight of the alkali-soluble novolac resin as the component (a) while the optimum amount thereof depends on the types of the photosensitive ingredient as the component (b). When the amount thereof is too small, the desired photosensitivity promoting effect cannot be obtained as a matter of course while use of a too large amount thereof is economically disadvantageous without obtaining further increased advantages thereby.

The inventive positive-working photoresist composition can be admixed with an auxiliary additive to improve the resolving power in fine patterning and to increase the film thickness retention in the unexposed areas by development. The additive used for this purpose is typically an isocyanurate compound exemplified by 1,3,5-tris(4-tert-butyl-3-hydroxy-2,6-dimethylbenzyl) isocyanurate, 1,3,5-tris(4-tert-butyl-3-hydroxy-2,6-diethylbenzyl) isocyanurate, 1,3,5-tris (3,5-di-tert-butyl-4-hydroxybenzyl) isocyanurate and the like. These additive compounds can be used either singly or as a combination of two kinds or more according to need. The amount thereof in the inventive composition is in the range, usually, from 0.5 to 15 parts by weight or, preferably, from 1.0 to 10 parts by weight per 100 parts by weight of the alkali-soluble novolac resin as the component (a).

Other optional additives which can be admixed with the inventive photoresist composition in a limited amount according to need include auxiliary resins, plasticizers and stabilizers to improve the properties of the patterned resist layer, coloring agents to improve the visibility of the patterned resist layer and so on.

The positive-working photoresist composition of the present invention is prepared by uniformly dissolving the above described essential components (a), (b) and (c) and/or (d) as well as the optional additives in a suitable organic solvent. Examples of the organic solvent suitable for the purpose include ketones such as acetone, methyl ethyl ketone, cyclohexanone, methyl isoamyl ketone and the like, polyhydric alcohols and derivatives thereof such as ethyleneglycol, ethyleneglycol monoacetate, diethyleneglycol and diethyleneglycol monoacetate as well as monomethyl, monoethyl, monopropyl, monobutyl and monophenyl ethers thereof, cyclic ethers such as dioxane and the like and esters such as ethyl lactate, methyl acetate, ethyl acetate, butyl acetate, methyl pyruvate, ethyl pyruvate, methyl methoxypropionate, ethyl ethoxypropionate and the like. These organic solvents can be used either singly or as a mixture of two kinds or more according to need.

To explain a typical procedure for the formation of a patterned resist layer on the surface of a substrate by using the positive-working photoresist composition of the present invention, a substrate such as a semiconductor silicon wafer is uniformly coated with the inventive photoresist composition in the form of a solution by using a suitable coating machine such as a spinner followed by drying and prebaking to form a uniform photoresist layer which is exposed patternwise to actinic rays such as ultraviolet light emitted from a ultraviolet light source such as low-pressure mercury lamps, high-pressure mercury lamps, ultrahigh-pressure mercury lamps, arc lamps, xenon lamps and the like through a photomask bearing a desired pattern or electron beams scanned along the desired pattern to form a latent image of the pattern followed by the development of the latent image by using a weakly alkaline aqueous solution, such as a 1 to 10% by weight aqueous solution of tetramethyl ammonium hydroxide, as a developer solution to dissolve away the photoresist layer patternwise in the areas exposed to the actinic rays leaving a patterned resist layer having high fidelity to the pattern on the photomask.

In the following, the inventive positive-working photoresist composition is described in more detail by way of examples which, however, never limit the scope of the invention in any way. Three kinds of cresol novolac resins, referred to as the novolacs I, II and III hereinafter, were used in the following examples and comparative examples, of which novolac I was prepared from 40:60 by weight mixture of m-cresol and p-cresol by the condensation reaction with formaldehyde in the presence of oxalic acid as the catalyst followed by fractionation to remove the low molecular weight fractions so as to have a weight average molecular weight of about 6000, novolac II was prepared in the same manner as above except that the fractionation was conducted so as to have a weight average molecular weight of 12000 and novolac III, which had a weight average molecular weight of 6000, was prepared in the same manner as above excepting the use of 60:40 by weight mixture of m-cresol and p-cresol.

In the following examples and comparative examples, the term of "parts" always refers to "parts by weight". The photoresist compositions prepared in the following examples and comparative examples were evaluated by the measurements of the properties thereof for the items given below according to the testing procedures described there.

(1) Photosensitivity

A silicon wafer was uniformly coated with the photoresist composition by use of a spinner followed by drying and prebaking on a hot plate at 110° C. for 90 seconds to form a resist layer having a thickness of 1.05 μm. This resist layer on the substrate surface was exposed patternwise to ultraviolet light through a pattern-bearing photomask on a minifying light-projection exposure machine (Model NSR-1755i7A, manufactured by Nikon Co., NA=0.50) for a varied exposure time stepwise increased from 0.1 second with increments of each 0.01 second to form a patterned latent image which was developed by a development treatment in a 2.38% by weight aqueous solution of tetramethylammonium hydroxide at 23° C. for 60 seconds followed by rinse for 30 seconds in a stream of running water and drying. Recording was made of the length of time of the ultraviolet exposure by which the resist layer on the exposed areas could be completely removed by being dissolved away in the development solution as a measure of the photosensitivity of the composition.

(2) Resolving power

The patternwise exposure of the resist layer was performed through a photomask of a line-and-space pattern of 0.5 μm width and the limiting resolution by the optimum exposure time was recorded as a measure of the resolving power.

(3) Heat resistance

A resist layer of a line-and-space pattern of 5 μm width was formed on the surface of a silicon wafer in the same manner as described above and the patterned resist layer on the substrate was heated for 5 minutes on a hot plate at 125° C., 130° C., 135° C. or 140° C. to record the lowest temperature at which deformation of the patterned resist layer was found.

(4) Cross sectional profile of line pattern

The cross sectional profile of a resist layer of a line-and-space pattern having a width of 0.4 μm was examined with a scanning electron microscope and the results were recorded in three ratings of "A" for good orthogonality of the cross section showing full suppression of the standing wave effect, "B" for somewhat trapezoidal cross section showing suppression of the standing wave effect and "C" for a cross sectional profile with wavy side lines showing absence of suppression of the standing wave effect.

(5) Depth of focusing

A line-and-space patterned resist layer was formed on a silicon wafer through a photomask of equal widths of line and space on a minifying light-projection exposure machine and patternwise exposure was repeated with a shift of the focusing point toward both sides at an exposure dose by which a line-and-space patterned resist layer with equal width of the line and space of 0.4 μm could be obtained and record was made of the range of the shift in the focusing point, by which a line pattern of 0.4 μm width having an orthogonal cross sectional profile was obtained, as the width of the focusing depth. The results were rated as "A", "B", "C" and "D" when the width of the focusing depth was at least 1.2 μm, in the range from 1.1 to 0.8 μm, in the range from 0.7 to 0.4 μm and 0.3 μm or smaller, respectively.

EXAMPLE 1

A positive-working photoresist composition was prepared by dissolving, in 350 parts of ethyleneglycol monoethyl ether acetate, 100 parts of the novolac I, 20 parts of an esterification product of 1.0 mole of 2,3,4,4'-tetrahydroxy benzophenone and 3.5 moles of naphthoquinone-1,2-diazide-5-sulfonyl chloride having an average degree of esterification of 88%, referred to as BP-1 hereinafter, 6 parts of an esterification product of 1.0 mole of bis(5-cyclohexyl-4-hydroxy-2-methylphenyl)-2-hydroxyphenyl methane and 2.0 moles of naphthoquinone-1,2-diazide-5-sulfonyl chloride having an average degree of esterification of 67%, referred to as TP-1 hereinafter, 20 parts of 1-[1-(4-hydroxyphenyl)isopropyl]-4-[1,1bis (4-hydroxyphenyl)ethyl] benzene, 1.2 parts of 1,3,5-tris(4-tert-butyl-3-hydroxy-2,6-dimethylbenzyl) isocyanurate and 2 parts of benzyl salicylate followed by filtration through a membrane filter of 0.2 μm pore diameter. This photoresist composition was subjected to the evaluation tests of various items to give the results shown in Table 1 below.

EXAMPLE 2

The formulation of the positive-working photoresist composition and the experimental procedure were substantially the same as in Example 1 except that the BP-1 and TP-1 were compounded each in an amount of 13 parts. The results of the evaluation tests of this photoresist composition are shown also in Table 1.

EXAMPLE 3

The formulation of the positive-working photoresist composition and the experimental procedure were substantially the same as in Example 2 except that the amount of benzyl salicylate was increased from 2 parts to 4.5 parts. The results of the evaluation tests of this photoresist composition are shown also in Table 1.

EXAMPLE 4

The formulation of the positive-working photoresist composition and the experimental procedure were substantially the same as in Example 1 except that the amounts of the BP-1 and TP-1 were 6 parts and 20 parts, respectively, instead of 20 parts and 6 parts, respectively. The results of the evaluation tests of this photoresist composition are shown also in Table 1.

EXAMPLE 5

The formulation of the positive-working photoresist composition and the experimental procedure were substantially the same as in Example 4 except that the amount of benzyl salicylate was increased from 2 parts to 4.5 parts. The results of the evaluation tests of this photoresist composition are shown also in Table 1.

EXAMPLE 6

The formulation of the positive-working photoresist composition and the experimental procedure were substantially the same as in Example 2 except that the novolac I was replaced with the same amount of the novolac II. The results of the evaluation tests of this photoresist composition are shown also in Table 1.

EXAMPLE 7

The formulation of the positive-working photoresist composition and the experimental procedure were substantially the same as in Example 6 except that the amount of benzyl salicylate was increased from 2 parts to 4.5 parts. The results of the evaluation tests of this photoresist composition are shown also in Table 1.

EXAMPLE 8

The formulation of the positive-working photoresist composition and the experimental procedure were substantially the same as in Example 2 except that the novolac I was replaced with the same amount of the novolac III. The results of the evaluation tests of this photoresist composition are shown also in Table 1.

COMPARATIVE EXAMPLE 1

The formulation of the positive-working photoresist composition and the experimental procedure were substantially the same as in Example 1 excepting for the omission of benzyl salicylate. The results of the evaluation tests of this photoresist composition are shown also in Table 1.

EXAMPLE 9

The formulation of the positive-working photoresist composition and the experimental procedure were substantially the same as in Example 1 except that the BP-1 was omitted and, instead, the amount of the TP-1 was increased from 6 parts to 26 parts. The results of the evaluation tests of this photoresist composition are shown also in Table 1.

EXAMPLE 10

The formulation of the positive-working photoresist composition and the experimental procedure were substantially the same as in Example 9 except that the amount of benzyl salicylate was increased from 2 parts to 4.5 parts. The results of the evaluation tests of this photoresist composition are shown also in Table 1.

EXAMPLE 11

The formulation of the positive-working photoresist composition and the experimental procedure were substantially the same as in Example 9 except that the novolac I was replaced with the same amount of the novolac III. The results of the evaluation tests of this photoresist composition are shown also in Table 1.

COMPARATIVE EXAMPLE 2

The formulation of the positive-working photoresist composition and the experimental procedure were substantially the same as in Example 1 except that the TP-1 and benzyl salicylate were omitted and the amount of the BP-1 was increased from 20 parts to 26 parts. The results of the evaluation tests of this photoresist composition are shown also in Table 1.

COMPARATIVE EXAMPLE 3

The formulation of the positive-working photoresist composition and the experimental procedure were substantially the same as in Comparative Example 1 excepting for the replacement of 20 parts of the BP-1 26 parts of an esterification product of 1.0 mole of 2,3,4-trihydroxybenzophenone and 2.5 moles of naphthoquinone-1,2-diazide-5-sulfonyl chloride having an average degree of esterification of 83%, referred to as BP-2 hereinafter, omission of the TP-1 and replacement of benzyl salicylate with the same amount of benzyl 4-hydroxybenzoate. The results of the evaluation tests of this photoresist composition are shown also in Table 1.

COMPARATIVE EXAMPLE 4

The formulation of the positive-working photoresist composition and the experimental procedure were substantially the same as in Comparative Example 3 excepting for the omission of benzyl 4-hydroxybenzoate. The results of the evaluation tests of this photoresist composition are shown also in Table 1.

EXAMPLE 12

The formulation of the positive-working photoresist composition and the experimental procedure were substantially the same as in Example 1 excepting for the replacement of benzyl salicylate with the same amount of 2-tert-butyl-4-methyl phenol. The results of the evaluation tests of this photoresist composition are shown also in Table 1.

EXAMPLE 13

The formulation of the positive-working photoresist composition and the experimental procedure were substantially the same as in Example 2 excepting for the replacement of benzyl salicylate with the same amount of 2-tert-butyl-4-methyl phenol. The results of the evaluation tests of this photoresist composition are shown also in Table 1.

EXAMPLE 14

The formulation of the positive-working photoresist composition and the experimental procedure were substantially the same as in Example 13 excepting for an increase in the amount of 2-tert-butyl-4-methyl phenol from 2.0 parts to 4.5 parts. The results of the evaluation tests of this photoresist composition are shown also in Table 1.

EXAMPLE 15

The formulation of the positive-working photoresist composition and the experimental procedure were substantially the same as in Example 12 except that the amount of the BP-1 was decreased to 6 parts and the amount of the TP-1 was increased to 20 parts, respectively. The results of the evaluation tests of this photoresist composition are shown also in Table 1.

EXAMPLE 16

The formulation of the positive-working photoresist composition and the experimental procedure were substantially the same as in Example 15 excepting for an increase in the amount of 2-tert-butyl-4-methyl phenol from 2.0 parts to 4.5 parts. The results of the evaluation tests of this photoresist composition are shown also in Table 1.

EXAMPLE 17

The formulation of the positive-working photoresist composition and the experimental procedure were substantially the same as in Example 12 excepting for omission of the BP-1 and an increase in the amount of TP-1 from 6 parts to 26 parts. The results of the evaluation tests of this photoresist composition are shown also in Table 1.

COMPARATIVE EXAMPLE 5

The formulation of the positive-working photoresist composition and the experimental procedure were substantially the same as in Example 17 excepting for omission of 2-tert-butyl-4-methyl phenol. The results of the evaluation tests of this photoresist composition are shown also in Table 1.

EXAMPLE 18

A photoresist composition was prepared by dissolving, in 350 parts of ethyleneglycol monoethyl ether acetate, 100 parts of the novolac I, 10 parts of an esterification product of bis(5-cyclohexyl-4-hydroxy-2-methylphenyl)-2-hydroxyphenyl methane and naphthoquinone-1,2-diazide-5-sulfonyl chloride in a molar ratio of 1:2 having an average degree of esterification of 67%, 10 parts of an esterification product of bis(4-hydroxy-3,5-dimethylphenyl)-3,4-dihydroxyphenyl methane and naphthoquinone-1,2-diazide-5-sulfonyl chloride in a molar ratio of 1:3.5 having an average degree of esterification of 88%, 10 parts of an esterification product of 2-(2,3,4-trihydroxyphenyl)-2-(2', 3', 4'-trihydroxyphenyl) propane and naphthoquinone-1,2-diazide-5-sulfonyl chloride in a molar ratio of 1.0:4.0 having an average degree of esterification of 67%, 25 parts of bis(4-hydroxy-3,5-dimethylphenyl)-2hydroxyphenyl methane, 1.6 parts of 1,3,5-tris(4-tert-butyl -3-hydroxy-2,4-dimethylbenzyl) isocyanurate and 3.1 parts of benzyl salicylate followed by filtration of the solution through a membrane filter of 0.2 μm pore diameter.

The results of the evaluation tests of this photoresist composition undertaken in the same manner as in Example 1 are shown in Table 1.

EXAMPLE 19

The formulation of the photoresist composition and testing procedure were substantially the same as in Example 18 described above excepting for the replacement of the photosensitizing ingredients with a combination of 15 parts of an esterification product of bis(5-cyclohexyl-4-hydroxy -2-methylphenyl)-2-hydroxyphenyl methane and naphthoquinone -1,2-diazide-5-sulfonyl chloride in a molar ratio of 1.0:2.0 having an average degree of esterification of 67% and 30 parts of an esterification product of bis(5-cyclohexyl-4-hydroxy-2-methylphenyl)-3,4-dihydroxyphenyl methane and naphthoquinone -1,2-diazide-5-sulfonyl chloride in a molar ratio of 1.0:2.5 having an average degree of esterification of 63%.

The results of the evaluation tests of this photoresist composition undertaken in the same manner as in Example 1 are shown in Table 1.

TABLE 1

|  | Photo-sensitivity, ms | Resolving power, μm | Heat resistance, °C. | Cross sectional profile | Depth of focusing |
|---|---|---|---|---|---|
| Example |  |  |  |  |  |
| 1 | 230 | 0.4 | 135 | A | B |
| 2 | 240 | 0.4 | 135 | A | A |
| 3 | 210 | 0.4 | 130 | B | B |
| 4 | 260 | 0.4 | 130 | A | A |
| 5 | 230 | 0.4 | 125 | B | B |
| 6 | 280 | 0.4 | 140 | A | A |
| 7 | 250 | 0.4 | 135 | B | B |
| 8 | 200 | 0.4 | 140 | A | B |
| 9 | 270 | 0.4 | 130 | A | A |
| 10 | 240 | 0.4 | 125 | B | B |
| 11 | 210 | 0.4 | 130 | A | B |
| 12 | 240 | 0.4 | 135 | A | B |
| 13 | 250 | 0.4 | 135 | A | A |
| 14 | 240 | 0.4 | 130 | B | B |
| 15 | 260 | 0.4 | 130 | A | A |
| 16 | 250 | 0.4 | 125 | B | B |
| 17 | 270 | 0.4 | 130 | A | A |
| 18 | 210 | 0.38 | 135 | A | A |
| 19 | 200 | 0.35 | 135 | A | A |
| Comparative Example |  |  |  |  |  |
| 1 | 240 | 0.4 | 140 | C | B |
| 2 | 210 | 0.4 | 140 | C | C |
| 3 | 200 | 0.4 | 140 | B | C |
| 4 | 210 | 0.4 | 140 | C | C |
| 5 | 290 | 0.4 | 140 | C | B |

What is claimed is:

1. A positive-working photoresist composition which comprises, as a uniform mixture:
   (a) an alkali-soluble novolac resin;
   (b1) 5 to 200 parts by weight per 100 parts by weight of component (a) of a photosensitive ingredient which is
      (i) an esterification product of the compound selected from the group consisting of 1-[1-(4-hydroxyphenyl) isopropyl]-4-[1,1-bis(4-hydroxyphenyl)ethyl] benzene, tris(hydroxyphenyl)methanes, tris(cyclohexylhydroxyphenyl) methanes and alkanes with naphthoquinone -1,2-diazide sulfonic acid, or
      (ii) a combination of at least two compounds selected from the group consisting of the naphthoquinone-1,2-diazide sulfonic acid esters of polyhydroxybenzophenones, 1-[1-(4-hydroxyphenyl)isopropyl]-4-[1,1-bis(4-hydroxyphenyl)ethyl] benzene, tris(hydroxyphenyl) methanes, tris(cyclohexylhydroxyphenyl) methanes and alkanes; and
   (c) 2 to 10 parts by weight per 100 parts by weight of component (a) of a hydroxy-substituted benzoic acid ester represented by the formula

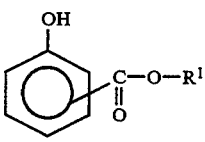

in which $R^1$ is an alkyl group having 1 to 12 carbon atoms or an aralkyl group having 7 to 10 carbon atoms.

2. The positive-working photoresist composition as claimed in claim 1 in which the component (c) is an ester of salicylic acid.

3. The positive-working photoresist composition as claimed in claim 2 in which the component (c) is benzyl salicylate.

4. The positive-working photoresist composition as claimed in claim 1 in which the tris(hydroxyphenyl) methane compound is selected from the group consisting of bis(4-hydroxy-3,5-dimethylphenyl)-2-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane and bis(4-hydroxy -2,5-dimethylphenyl)-3,4-dihydroxyphenyl methane.

5. The positive-working photoresist composition as claimed in claim 1 in which the tris(cyclohexylhydroxyphenyl) methane compound is selected from the group consisting of bis(5-cyclohexyl -4-hydroxy-2-methylphenyl)-2-hydroxyphenyl methane, bis (5-cyclohexyl-4-hydroxy-2-methylphenyl)-3-hydroxyphenyl methane, bis(5-cyclohexyl-4-hydroxy-2-methylphenyl)-4-hydroxyphenyl methane and bis(5-cyclohexyl-4-hydroxy-2-methylphenyl)-3,4-dihydroxyphenyl methane.

6. The positive-working photoresist composition as claimed in claim 1 in which the alkane compound is selected from the group consisting of 2-(2,3,4-trihydroxyphenyl) -2-(2', 3', 4'-trihydroxyphenyl) propane, 2-(2,4dihydroxyphenyl) -2-(2', 4'-dihydroxyphenyl) propane, 2-(4hydroxyphenyl) -2-(4'-hydroxyphenyl) propane, bis(2,3,4-trihydroxyphenyl) methane and 2,4-dihydroxyphenyl methane.

7. The positive-working photoresist composition as claimed in claim 1 in which the polyhydroxybenzophenone compound is 2,3,4-trihydroxybenzophenone or 2,3,4,4'-tetrahydroxybenzophenone.

8. A positive-working photoresist composition which comprises, as a uniform mixture:
   (a) an alkali-soluble novolac resin;
   (b) 5 to 200 parts by weight per 100 parts by weight of component (a) of an esterification product of an aromatic polyhydroxy compound with naphthoquinone-1,2-diazide sulfonic acid; and
   (d) 2 to 10 parts by weight per 100 parts by weight of component (a) an alkyl-substituted aromatic hydroxy compound represented by the formula

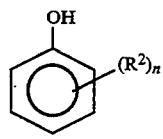

in which $R^2$ is an alkyl group having 1 to 5 carbon atoms and n is a positive integer not exceeding 5.

9. The positive-working photoresist composition as claimed in claim 8 in which the component (d) is a compound selected from the group consisting of 4-tert-butyl-5-methyl phenol, 2-tert-butyl-4-methyl phenol, 2-tert-butyl-6-methyl phenol and 2-tert-butyl-5-methyl phenol.

* * * * *

UNITED STATES PATENT AND TRADEMARK OFFICE
CERTIFICATE OF CORRECTION

PATENT NO. : 5,434,031
DATED : July 18, 1995
INVENTOR(S) : Taku NAKAO et al.

It is certified that error appears in the above-indentified patent and that said Letters Patent is hereby corrected as shown below:

Col. 13 Claim 1, line 12, before "alkanes" insert

--[(poly)hydroxyphenyl]--; and line 21, before "alkanes" insert

--[(poly)hydroxyphenyl]--.

Col. 14 Claim 6, line 2, before "alkane" insert

--[(poly)hydroxyphenyl]--;

line 5, change "dihydroxyphenyl" (first occurrence) to -- -dihydroxyphenyl--; and line 6, change "hydroxyphenyl" (first occurrence) to -- -hydroxyphenyl--.

Signed and Sealed this

Nineteenth Day of December, 1995

Attest:

BRUCE LEHMAN

*Attesting Officer*          *Commissioner of Patents and Trademarks*